(12) United States Patent
Griffiths et al.

(10) Patent No.: US 7,701,285 B2
(45) Date of Patent: Apr. 20, 2010

(54) POWER AMPLIFIERS HAVING IMPROVED STARTUP LINEARIZATION AND RELATED OPERATING METHODS

(75) Inventors: James R. Griffiths, Chandler, AZ (US); David M. Gonzalez, Mesa, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 78 days.

(21) Appl. No.: 12/051,450

(22) Filed: Mar. 19, 2008

(65) Prior Publication Data
US 2009/0237156 A1    Sep. 24, 2009

(51) Int. Cl.
*H03F 1/36* (2006.01)
(52) U.S. Cl. .......................... 330/86; 330/282
(58) Field of Classification Search ............ 330/86, 330/278, 282, 285, 296, 310
See application file for complete search history.

(56) References Cited

U.S. PATENT DOCUMENTS

| | | | |
|---|---|---|---|
| 6,388,525 B1 | 5/2002 | Bien | |
| 6,919,761 B2* | 7/2005 | Cho et al. | 330/282 |
| 6,933,786 B1* | 8/2005 | Mohandas et al. | 330/86 |
| 2006/0197592 A1* | 9/2006 | Chang | 330/86 |

OTHER PUBLICATIONS

Van Bezooijen, A., Biasing Circuits for Voltage Controlled GSM Power Amplifiers, 11th GAAS Symposium, Munich 2003, pp. 403-406.

* cited by examiner

*Primary Examiner*—Khanh V Nguyen
(74) *Attorney, Agent, or Firm*—Ingrassia, Fisher & Lorenz, P.C.

(57) ABSTRACT

Systems and methods are described for improving the startup linearization of a power amplifier. A bias network is provided to generate a bias signal during amplifier startup, and the amplifier is configured to produce an output signal in response to the input signal and the bias signal. A variable impedance is provided to couple the input signal and the output signal in parallel with the amplifier. A controller is configured to apply a weighting function to the variable impedance over at least a startup phase of the amplifier system. By applying a non-linear or other weighting function to the variable impedance during startup, the gain of the amplifier can be controlled to thereby extend a time period over which the output power of the amplifier increases in a generally linear manner toward an operating level.

23 Claims, 6 Drawing Sheets

POWER AMPLIFIERS HAVING IMPROVED STARTUP LINEARIZATION AND RELATED OPERATING METHODS

TECHNICAL FIELD

Embodiments of the subject matter described herein relate generally to amplifier systems. More particularly, various embodiments relate to power amplifiers with improved linearization resulting from variable feedback.

BACKGROUND

"Amplifiers" are any devices, circuits or systems capable of converting an input signal into an output signal with an increased energy level. Amplifier circuits and systems are used in many different applications. Conventional mobile phones, for example, commonly incorporate power amplifier systems to amplify radio frequency (RF) signals that are transmitted from the phone to a base station or other receiver. Generally, amplifier systems include any number of transistors or other non-linear gain elements that are capable of increasing an electrical current or voltage representing the input signal. The ratio of the magnitude of the output to the magnitude of the input of an amplifier is commonly called the "gain" of the amplifier.

In many applications, such as many conventional Global System for Mobile communications (GSM) telephones, the RF input power of the amplifier is held relatively constant during operation. Changes in the output power are accomplished by adjusting the bias level of the transistors found in the amplifier to adjust the amplifier gain. This arrangement, while effective in many ways, creates a relatively high degree of design sensitivity as the amplifying element is "biased on" by the RF input power. In particular, this design can be difficult to control during power-up, since the sudden presence of input RF power can result in the output power "snapping on" in a relatively quick manner. In many amplifier circuits, this quick start-up can produce transient signals that can lead to undesirable effects. Moreover, inherent instability at low bias levels can create undesirable oscillations in the amplifier, which in turn can lead to non-compliance with design specifications or other undesirable effects.

Accordingly, it is desirable to provide amplifier systems and techniques that improve startup performance. Other desirable features and characteristics will become apparent from the subsequent detailed description and the appended claims, taken in conjunction with the accompanying drawings and the foregoing technical field and background.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments.

According to various embodiments, systems and methods are described for improving the startup linearization of a power amplifier. By extending the range over which a transistor amplifier is brought up to its operating power, transients and oscillation that commonly result from quick "snap on" power-ups can be avoided. In an example embodiment, a relatively constant input power signal is applied to the power amplifier, and a bias network is provided to generate a ramp or other suitable bias signal during amplifier startup. A variable impedance is provided in a feedback loop, and this impedance is varied as the bias signal is applied. By applying a non-linear weighting function to the variable impedance during startup, the gain of the amplifier can be dynamically adjusted over the control voltage range. Through this adjustment, the time period over which the output power of the power amplifier increases in a substantially linear manner toward the operating power level can be extended, thereby improving amplifier performance.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

As used herein, the term "substantially" is intended to encompass any slight variations due to design or manufacturing imperfections, device or component tolerances, and/or other factors. Moreover, the term "substantially" allows for variation from a perfect or ideal case. "Substantially linear", for example, simply means predominantly linear, or having a waveform that is identifiably more linear than exponential or otherwise non-linear.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description may refer to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, the terms "first", "second" and other such numerical terms referring to structures or elements do not imply a sequence or order unless clearly indicated by the context.

For the sake of brevity, conventional techniques related to power amplifier design, variable impedances, variable gain elements, wireless transmitters, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Figure 1:
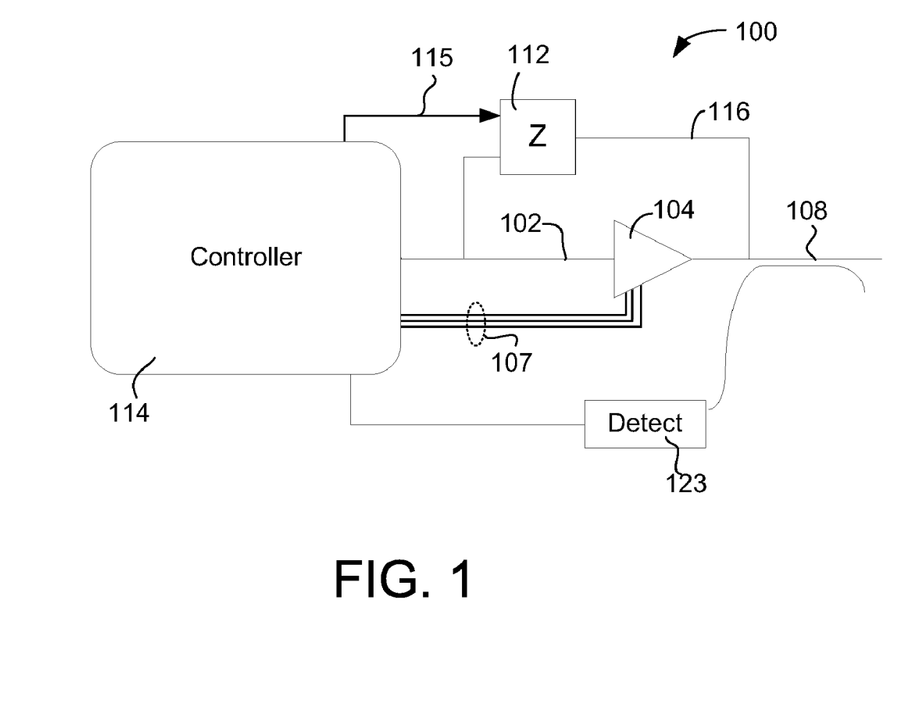
FIG. 1 is a block diagram of an exemplary amplifier system.

Turning now to the drawing figures and with initial reference to FIG. 1, an exemplary system 100 suitably includes a power amplifier 104 that is capable of amplifying an input signal 102 to produce an output signal 108. The input signal 102 may be an RF signal, for example, that is to be transmitted from a mobile phone to a remote base station or other receiver; alternately, input signal 102 may be any other signal produced by any sort of transmitter, transceiver, controller 114 or other system or module as appropriate. System 100 is also shown with variable feedback impedance 112 across amplifier 104 that is responsive to a feedback impedance control signal 115, as well as a detector 123 that provides a power feedback signal 116 to controller 114.

In various embodiments, a controller 114 represents any sort of digital and/or analog processing circuitry, software or other logic capable of directing the operation or output of amplifier 104. In the exemplary embodiment shown in FIG. 1, a common controller 114 is shown providing input signal 102, various bias control signals 107, and feedback impedance control signal 115, as well as receiving a power feedback signal 116 from detector 123. In other embodiments, input signal 102 may be provided from a component that is separate from the component(s) that provide bias signals 107 and/or feedback impedance control signal 115, or that receive power indication 116.

Detector 123 is any device, circuit, system or other logic capable of providing a suitable indication 116 that is representative of the power of output signal 108. Such an indication 116 may incorporate a simple voltage or current measurement that is integrated or otherwise observed over time (e.g. at detector 123, controller 114 and/or any other component), for example.

Figure 2:
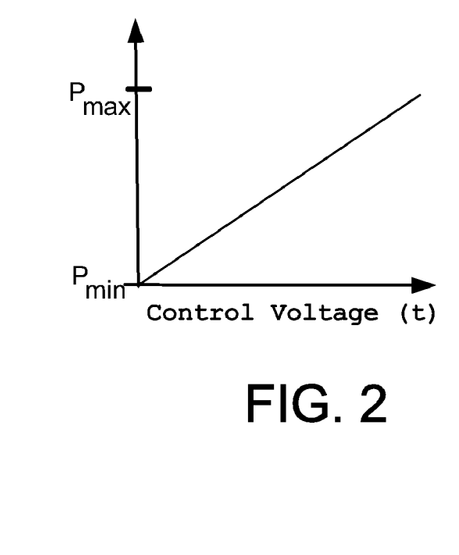
FIG. 2 is a plot of an ideal transfer function for the exemplary amplifier system of FIG. 1.

In operation, amplifier 104 is able to receive and amplify input signal 102 in response to bias signals 107 and/or feedback impedance control signal 115 to produce output signal 108. The power of output signal 108 may be detected in any manner, and this output power may be used, for example, to adjust or control the bias control signals 107 applied to amplifier 104. FIG. 2, for example, shows an exemplary plot of an ideal transfer characteristic for system 100 wherein the output power (indicated on the vertical axis in FIG. 2) increases linearly with the voltage of applied bias (which is plotted with exemplary values on the horizontal axis of FIG. 2). When the bias voltage increases linearly (e.g. during a startup mode of many exemplary embodiments), the horizontal axis of FIG. 2 may also represent time. As can be seen, the output power ideally would increase linearly with bias voltage/time as amplifier 104 is powered up to reduce transients and vibrations, and to otherwise provide optimal operation.

To prevent sudden increases in output power, then, feedback logic 114 can be provided to adjust the gain of one or more amplifier stages 103, 106 as one or more bias signals 107 are applied. With reference again to FIG. 1, for example, controller logic 114 applies a suitable transfer function to the received signal 116 to control the gain of amplifier 104. This transfer function is implemented using any sort of control signal(s) 115 that can be applied to any appropriate circuitry to adjust the amplifier gain. In the illustrated example, signal 115 suitably adjusts a variable impedance 112 that controls the amount of feedback across amplifier 104. As amplifier 104 is initially turned on, for example, impedance 112 can be reduced (or even shorted) so that a relatively large feedback signal is initially applied across amplifier 104 to significantly enhance stability, albeit at the expense of amplifier gain. As the bias voltage ramps up over time, the impedance 112 applied can be increased to controllably allow more gain to be applied and to produce more output power without generating significant transients, oscillations and/or other adverse effects. Further, the impedance 112 can be adjusted in a non-linear manner that matches the non-linear gain characteristics of amplifier 104, thereby allowing for more precise control over the output power than would be available from simple application of bias control signals 107. The feedback impedance loop can therefore be configured to extend a time period over which the output power of the amplifier increases to an operating level in response to a gain control component of the bias signal produced during at least the startup phase of the amplifier system.

Figure 3:
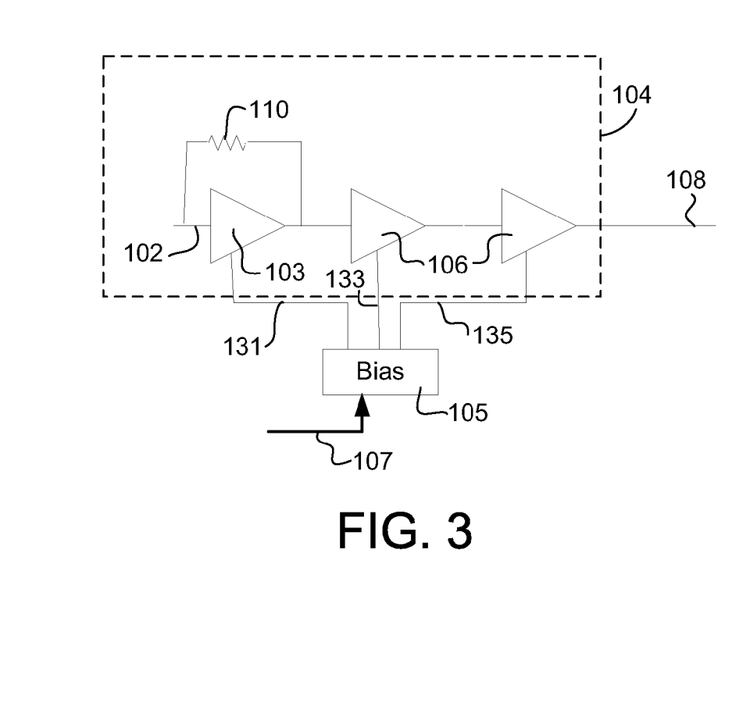
FIG. 3 is a block diagram of an exemplary amplifier system with fixed feedback.

With reference now to FIG. 3, various techniques for operating an amplifier 104 involve controlling the bias signals 131, 133, 135 provided to one or more gain stages 103, 106 of the amplifier 104. In the embodiment shown in FIG. 3, a relatively static or unchanging feedback impedance 110 is shown across gain stage 103. Frequently, bias signals 131, 133, 135 are produced by bias circuitry 105 or other logic in response to bias control signals 107 received from controller 114 (FIG. 1) or another component. Alternatively, controller 114 or another component may produce bias signals 131, 133, 135 directly, without the need for additional bias circuitry 105.

During typical operation, each amplifier stage is powered on by the application of input signal 102, and bias network 105 applies suitable bias signals 107 to one or more amplifier stages 103, 106 to place the amplifier stage 103, 106 into a desired operating state. During a startup phase, for example, bias network 105 can apply a bias signal 131, 133, 135 that has a ramp waveform that gradually increases with time. In such embodiments, the output signal 108 generated by the amplifier stage 104, 106 typically remains relatively flat until a threshold voltage is reached (e.g. a threshold of approximately 0.3 volts in amplifiers that are based upon silicon-based devices or 1.2 volts for gallium arsenide devices), at which point the output signal power increases dramatically. As can be seen from FIG. 4, a conventional power amplifier that relies solely on bias control turns on very quickly when the applied bias voltage exceeds the threshold voltage of the gain element. If the gain element is a silicon transistor, for example, a bias voltage even slightly in excess of 0.3 volts results in very quick provision of output power. That is, the output power rises very quickly over region 161 as the bias voltage ($V_{agc}$) increases from about 0.3 volts to about 0.5 volts in this example. This relatively sudden increase in operating power may have undesirable effects, including the spurious emissions and transient effects discussed above.

Figure 5:
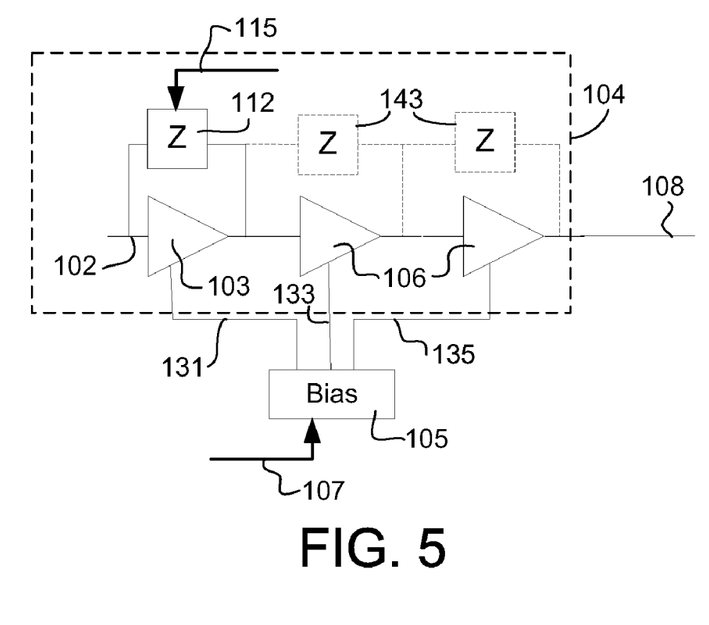
FIG. 5 is a block diagram of an exemplary amplifier system with variable feedback.

To reduce these effects, however, variable feedback impedance can be introduced to expand the linearity of the power transfer curve, thereby making the transfer curve more ideal. As shown in FIG. 5, for example, an exemplary amplifier 104 includes variable feedback impedance 112 applied across one or more gain stages 103. Although FIG. 5 shows amplifier 104 as including three gain stages 103, 106 with variable feedback 112 applied across stage 103, other embodiments may have any number of gain stages, with each of the various gain stages having no feedback, static feedback, or variable feedback as appropriate, as represented by feedback modules 143 and the dashed lines in FIG. 5. In still other embodiments, feedback 112 could be placed in parallel with multiple gain stages to thereby extend from the input signal 102 to the output of any stage 106 in an alternate embodiment. In the embodiment shown in FIG. 5, variable impedance 112 receives an impedance control signal 115 from controller 114 (FIG. 1) or another signal source as appropriate. While variable feedback impedance has been used in other amplifier systems, such feedback has been used to create instantaneous gain settings, without regard to amplifier performance over time. That is, while the concept of setting a desired amplifier gain by manipulating a feedback impedance may have been previously established, such concepts have not been applied to achieve improved linearity, particularly during startup. One example of such performance is shown in FIG. 6.

Figure 4:
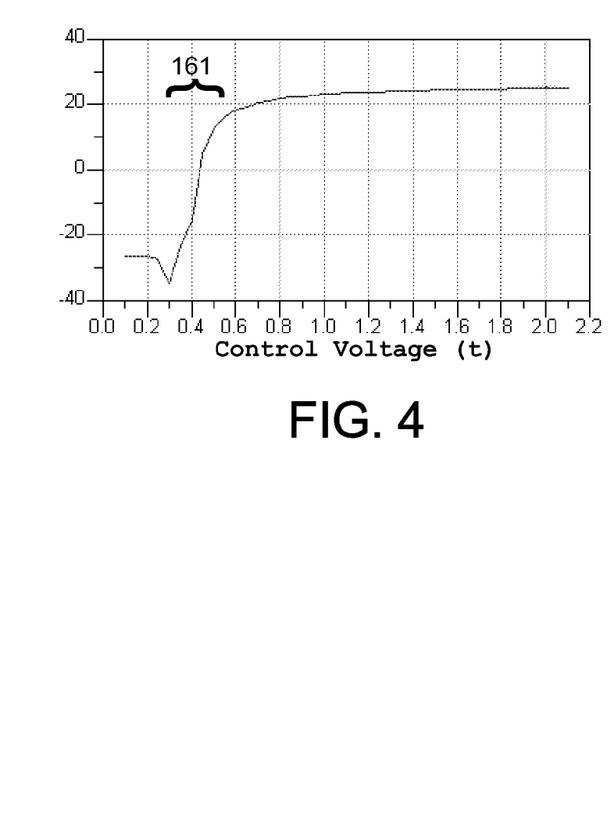
FIG. 4 is a plot of an exemplary transfer function for the exemplary amplifier system of FIG. 3.
Figure 6:
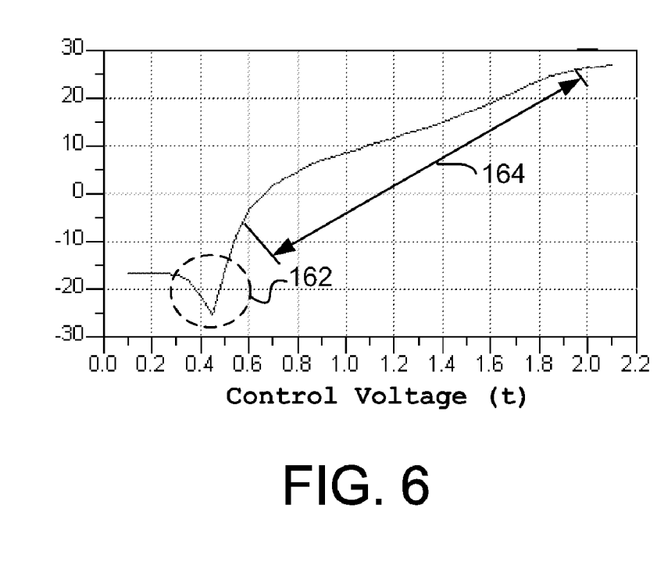
FIG. 6 is a plot of an exemplary transfer function for the exemplary amplifier system of FIG. 6.

In contrast to the plot shown in FIG. 4, FIG. 6, shows a much longer linear region 164 that extends from about 0.5 volts to about 2.0 volts (other embodiments may use other numerical values). This improved linearization results from the application of a suitable control function to the amplifier gain that allows for improved control of amplifier performance, including more gradual and controllable startup behavior. The gradual increase in output power represents a significant improvement over the FIG. 4 performance, since the gradual provision of power will result in far fewer transient and oscillation effects in practice. Also note that both FIGS. 4 and 6 show slight levels of leakage current below the threshold voltage, as best seen in region 162 of FIG. 6. This leakage can be reduced or prevented through the use of a static impedance in the feedback path, as described more fully below.

Figure 7:
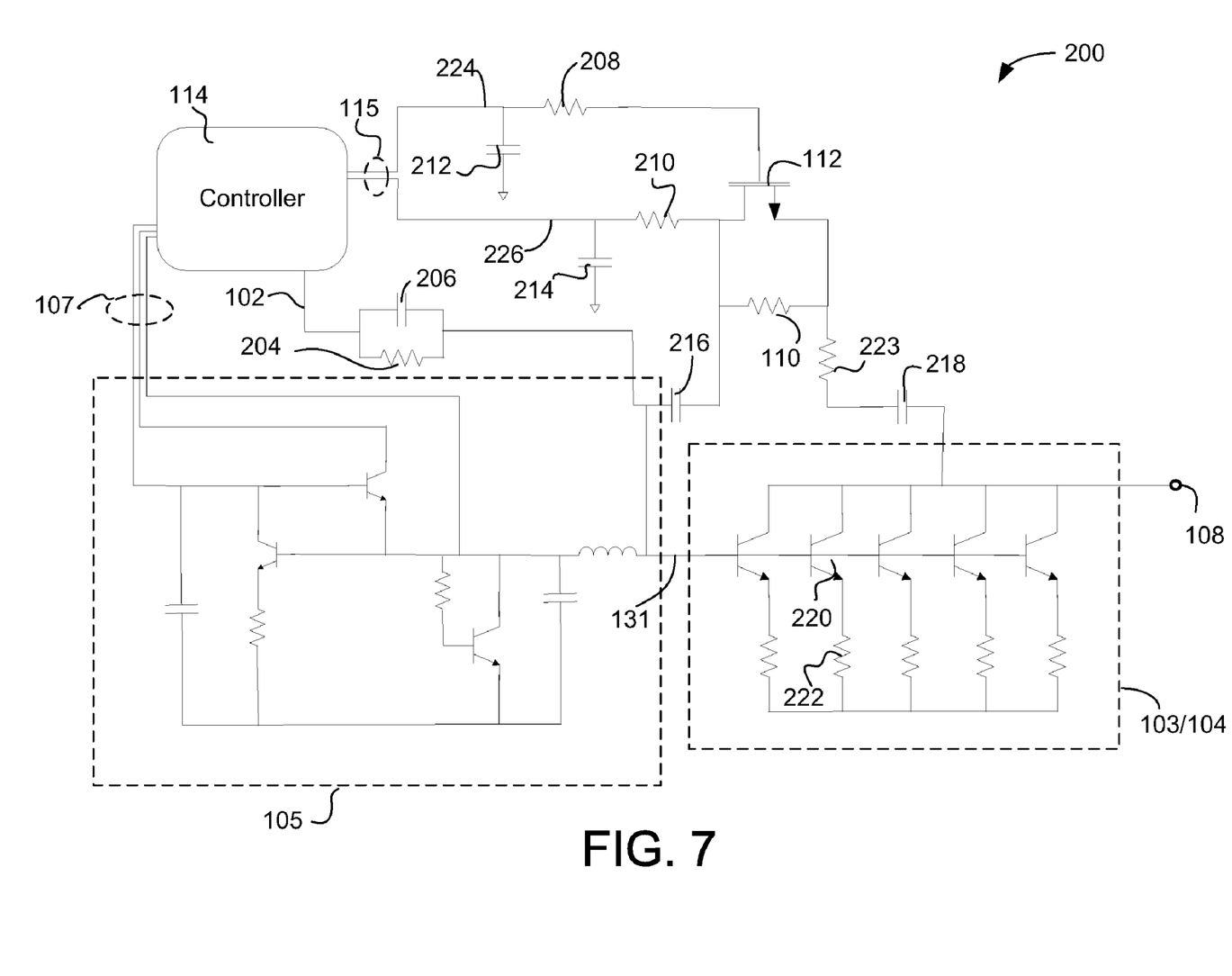
FIG. 7 is a circuit diagram of an exemplary amplifier system.

FIG. 7 shows a more detailed implementation of an amplifier system 200 suitable for use in an RF amplifier such as that found in a portable telephone. In this example, system 200 suitably includes a power amplifier 104, a bias network 105, and controller 114 capable of applying a weighting function across a variable feedback impedance 112. By varying the feedback impedance across amplifier 104, the gain of amplifier 104 can be controlled over time to improve linearization and to avoid adverse effects during startup.

As noted above, controller 114 is any hardware, software, firmware and/or other logic capable of producing desired output 108 from amplifier 104. In various embodiments, controller 114 includes a digital or analog interface as well as any sort of microprocessor, microcontroller, digital signal processor, mixer, filter, modulator, transceiver and/or other control module as appropriate. Although many embodiments may be implemented with digital control logic, alternate embodiments may provide any sort of analog or hybrid digital/analog circuitry as appropriate. In various embodiments, controller 114 may be operable to provide a feedback control signal 115, an input signal 102, and/or one or more bias control signals 107. Although FIG. 7 shows a single controller 114 as providing all of these signals, equivalent embodiments may split processing or provision of signals 102, 107 and/or 115 across any number of components in any manner.

Amplifier 104 is any circuit, module or other logic capable of amplifying an input signal to produce a resulting amplified output signal 108. Amplifier 104 may include any number of gain stages (including a single gain stage). In the embodiment shown in FIG. 7, for example, amplifier 104 is a single stage amplifier that includes five transistors 220 or other non-linear amplifying elements, each with an associated impedance 222 as appropriate, making up a single gain stage 103. In other embodiments, any number of other gain stages 103, 106 (see, e.g., FIGS. 3 and 5) may be provided.

In various embodiments, the non-linear amplifying elements 220 used in the various gain stages 103 may be any sort of hetero-junction bi-polar transistors (HBT), as are commonly used in conventional RF power amplifier circuits. Due to the improved linearization that may result from various embodiments, however, other types of gain elements such as conventional bipolar junction transistors (BJTs), metal epitaxial semiconductor field effect transistors (MESFETs), pseudomorphic high electron mobility transistors (pHEMTs), complementary metal oxide semiconductor (CMOS) field effect transistors (FETs) and/or the like could be used as well. In the case of a BJT, for example, the exponential relationship between collector current ($I_c$) and base voltage ($V_b$) may have been difficult to manage using prior art control techniques. Similarly, the quadratic relationship between drain current ($I_D$) and gate voltage ($V_G$) in a conventional FET could be difficult to manage using only prior art manipulation of bias voltage. By applying a non-linear weighting function to the feedback impedance across the device, however, a wide array of non-linear amplification devices can be used in various embodiments, thereby greatly improving design flexibility in a number of applications. Again, the control of any type of non-linear amplification elements could be used in a wide array of equivalent embodiments.

Bias network 105 is any circuitry or other logic capable of applying a suitable bias signal 131 to obtain desired results from amplifier 104. Bias network 105 may be responsive to one or more bias control signals 107 provided by any control interface (e.g. controller 114) as appropriate. In the embodiment shown in FIG. 7, bias network 105 includes appropriate amplification and filter elements to bias amplifier 104 to produce an appropriate signal gain during steady-state operation. Further, bias network 105 responds to appropriate signals 107 applied at the input to generate an automatic gain control voltage ($V_{age}$) during system startup. This gain control component of the bias signal applied to amplifier 104 may exhibit a ramp waveform that linearly increases over time, for example, during the startup period. After the startup phase/period is complete, the bias signal may remain relatively static, or may be adjusted (e.g. by controller 114) as desired. Design of bias network 105 will vary significantly from embodiment to embodiment, and many different amplifier bias network designs are well-known in the art.

Bias signal 131 is produced by bias network 105 and applied to one or more stages (e.g. stage 103) of amplifier 104 in any manner. In the embodiment shown in FIG. 7, the input power to amplifier 104 is generally fixed through the application of input signal 102 during operation. Input signal 102 is appropriately scaled, filtered and/or otherwise adjusted by components 204 and 206, and is applied to amplifier stage 103 along with bias signal 131. Various equivalent embodiments may apply the same bias signal 131, other bias signals (e.g. signals 133, 135 in FIGS. 3 and 5) and/or input signal 102 to one or more gain stages 103, 106 of amplifier 104 in any other manner.

The feedback loop coupling the input signal 102 and output signal 108 of amplifier stage 103 suitably includes any sort of variable impedance as appropriate; some embodiments may also include a fixed impedance in series and/or parallel with the variable impedance, as described more fully below. In the embodiment illustrated in FIG. 7, the feedback loop includes a variable impedance that includes an adjustable impedance 112 shown in parallel with a more static impedance 110. Adjustable impedance 112 may be a FET or other non-linear conducting element, for example. In such embodiments, one or more control signals 224 and/or 226 applied to the gate and/or source of FET 112 can be used to adjust the impedance across the device, therefore creating a variable impedance across amplifier 104. The parallel combination of FET 112 and resistor 110, for example, may be capable of creating a variable resistance having virtually any value between zero (corresponding to a short circuit between the source and drain terminals of FET 112) and the value of resistor 110 (corresponding to an open circuit between the source and drain terminals of FET 112). The particular circuit components and configurations may be adjusted in any manner to create any sort of gain control arrangement. Different types of variable resistances or impedances may be used, for example, including any type of transistors or switches, and such elements may be configured in any manner.

The variable impedance used to adjust the gain of amplifier 104 may be deployed in conjunction with any sort of fixed feedback impedance. Resistor 223, for example, may be placed in series with the parallel combination of FET 112 and resistor 110 to scale the overall impedance and/or to ensure that some feedback impedance is present at all times, including times when the bias voltage is not applied. This may be useful, for example, in preventing leakage currents from passing through the feedback loop, as shown by region 162 of FIG. 6. Capacitors 216 and 218 are also shown as providing a fixed feedback impedance that may be useful for filtering or other purposes. Fixed feedback impedances may be implemented in any other manner and/or may be located in any other location. Indeed fixed feedback need not be present, and may be omitted entirely in some embodiments.

The gain of amplifier 104 (or any particular gain stage 103 of amplifier 104) may be controlled in any manner during operation. In various embodiments, controller 114 applies any suitable weighting function to variable impedance element 112. Generally speaking, controller 114 provides one or more control signals 224, 226 (corresponding to control signal 115 described above) that are configured to adjust the gain of amplifier 104. In some embodiments, the gain may be adjusted in response to feedback signal 116 described above. Equivalently, the gain may be adjusted in conjunction with or in response to the bias applied to amplifier 104, or any other factors as appropriate.

In the exemplary embodiment shown in FIG. 7, control signals 224 and 226 are applied to the gate and drain terminals of FET 112 to adjust the impedance across amplifier 104 as appropriate. The signals applied may be determined based upon any sort of digital or analog signal processing, such as any sort of computation, table look-up, or the like. Control signals 224 and 226 may be applied using any sort of filtering or shaping circuitry, such as resistors 208 and 210 (respectively) and/or capacitors 212 and 214 (respectively).

In operation, then, control signals 224 and 226 can be used to apply any sort of weighting function to the gain of amplifier 104 during system startup, or at any other time during operation of amplifier 104. In an exemplary embodiment taking place at system startup, for example, bias network 105 suitably applies a bias signal 131 that has a ramping waveform that increases gradually in response to control signals 107 as amplifier 104 comes online. As this ramping bias is applied, feedback controller 114 adjusts the feedback impedance across amplifier 104 by applying appropriate signals 224/226 to variable impedance 112. Starting with relatively low feedback impedance, for example, allows for improved stability at the expense of gain at the outset. As the bias signal 131 increases, however, the feedback impedance can be increased in any manner (e.g. a non-linear manner) to reduce the amount of feedback applied at the input of amplifier 104, thereby increasing the gain of the amplifier in a controlled manner.

Figure 8:
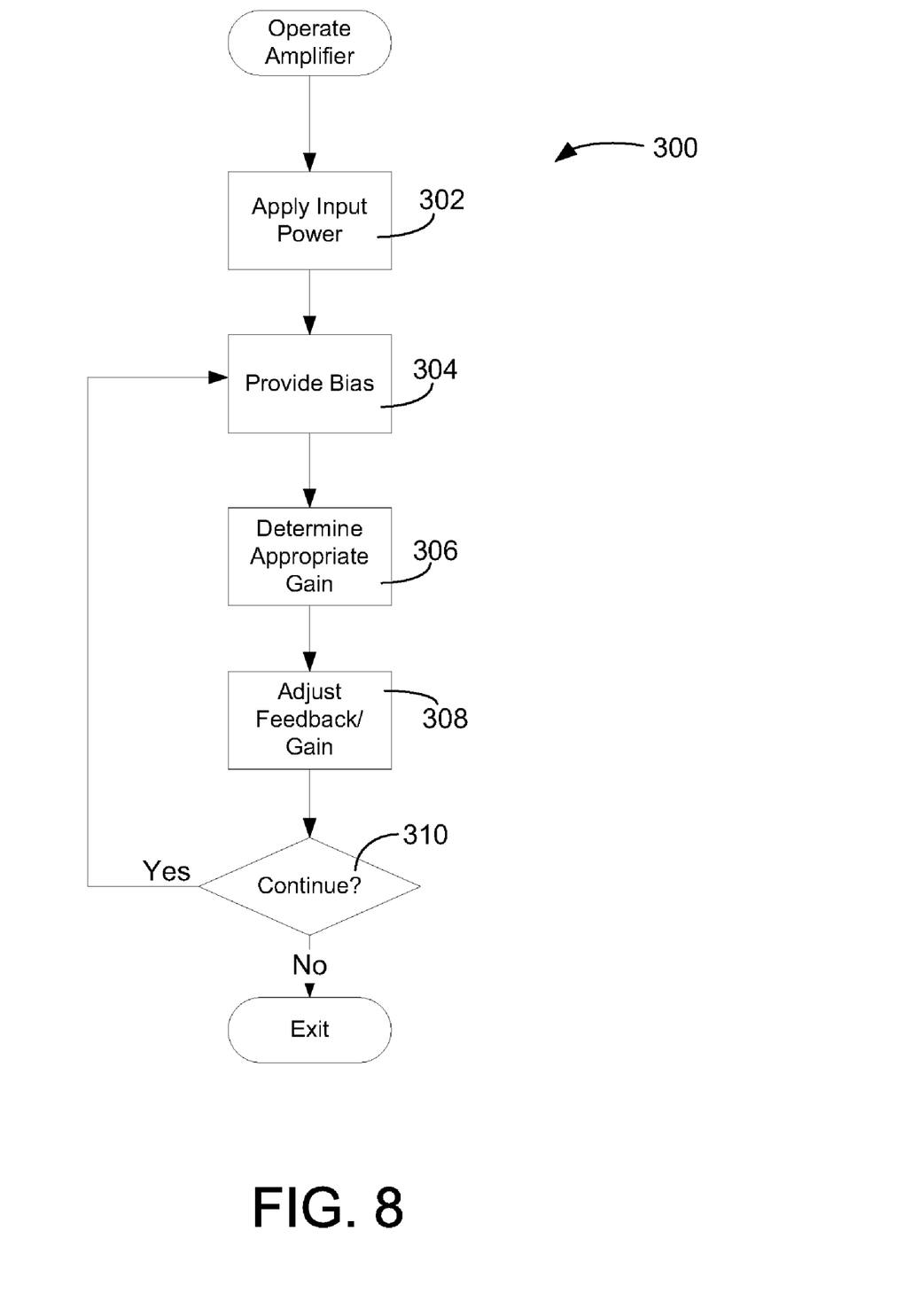
FIG. 8 is a flowchart of an exemplary process for operating a power amplifier.

FIG. 8 shows a flowchart of an exemplary control method 300 that can be partially or entirely carried out within controller 114 or other digital or analog logic in communication with logic 114. In various embodiments, control technique 300 is implemented in a digital computer executing software or firmware written in any language and stored in a digital memory or the like. Other embodiments may be implemented with conventional analog components, or any combination of digital, analog and/or software features.

Method 300 suitably includes the broad steps of applying the input power (step 302), providing the bias signal (step 304), determining a desired amplifier gain (step 306) in any manner, and adjusting the feedback parameter as appropriate (step 308). The method 300 may be executed at any point during operation of amplifier 104, such as during startup, and may be repeated as often as desired (step 310).

Applying input power (step 302) typically involves providing an RF or other input signal (e.g. signal 102) to amplifier 104 as appropriate. In a conventional RF power amplifier embodiment, input signal 102 may be a typical RF input that has substantially constant power. An encoded audio signal modulated at a carrier frequency, for example, would generally exhibit such characteristics, as would any number of other signals.

The input power 302 may be combined or otherwise provided with any number of bias signals 107 as appropriate (step 304). As noted above, bias signal 107 generally has at least a component during start-up that has a ramping or sloping waveform (e.g. $V_{agc}$), although other embodiments may be configured or operated differently. As noted above, the bias signal 107 need not directly provide the input to controller 114; instead, information about the bias signal or any relevant component thereof (e.g. $V_{agc}$) may be inferred from bias signal 107, output signal 108, or the like. Amplifier gain can be adjusted over time in response to the power of output signal 108, for example, in various equivalent embodiments.

As noted above, the desired amplifier gain can be determined in any manner (step 306). As noted above, determination step 306 may involve a digital and/or analog signal manipulation, table lookup, and/or any other actions as appropriate. Alternately, determination step 306 may involve measuring the output power of signal 108 and/or correlating any measured values to a desired gain. In various embodiments, a weighting function is applied in controller 114 that implements any desired relationship between bias signal 107 and the feedback signals 224, 226 used to adjust the gain of amplifier 104. Alternate embodiments can correlate desired output power to either or both of amplifier gain and feedback impedance using any sort of weighting function. With the particular feedback parameter thereby determined, the resulting parameter can be applied to adjust the feedback across amplifier 104 (step 308 in FIG. 8). In various embodiments, feedback adjustment may be provided by adjusting a variable impedance 112 as described above. This adjustment can be performed using any other structures or techniques, including those set forth above and any number of equivalents.

In various embodiments, the weighting function applied in step 306 may be a non-linear function (e.g. an exponential, square, cubic and/or other function) that allows the power output of amplifier 104 to follow a desired pattern. The particular function applied will vary significantly from embodiment to embodiment based upon such variable factors as the number of gain stages, the dynamic range desired, the level of input power, any variable bias current or supply voltage, any variable attenuation and/or any other factors as appropriate. Generally speaking, however, a simple embodiment may be formulated wherein the feedback resistance ($R_F$) applied across the amplifier is configured in response to the ramping portion ($V_{agc}$) of the bias signal as:

$$R_F = -A * \left[\frac{V_{age}}{B}\right]^X + C \quad (1)$$

wherein A, B, and C are any relatively constant scaling values (which may change between operating modes of amplifier 104) and X is any desired exponent. When $V_{age}$ varies linearly with time and X is greater than 1, the result of Equation (1) will be a non-linear variation in the feedback impedance over time, which in turn will have the effect of slowing the amplifier gain during start-up as desired.

Figure 9:
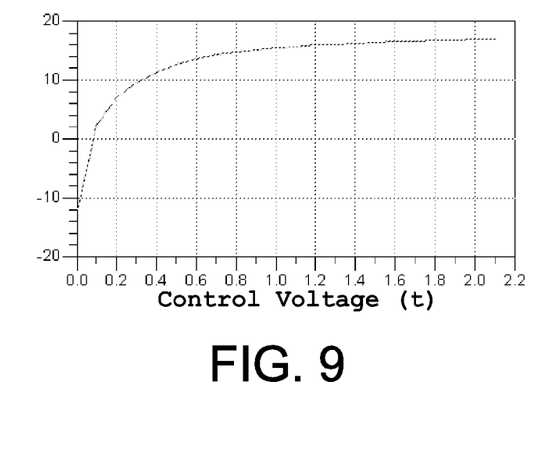
FIG. 9 is an exemplary plot of power output when direct voltage control is applied to a gain stage of an amplifier.
Figure 10:
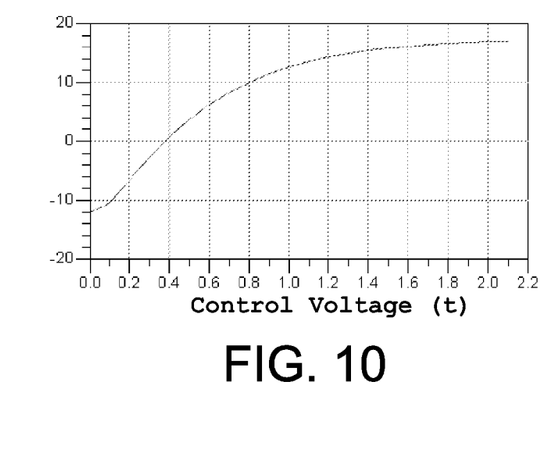
FIG. 10 is an exemplary plot of power output when second order control is applied to a gain stage of an amplifier.
Figure 11:
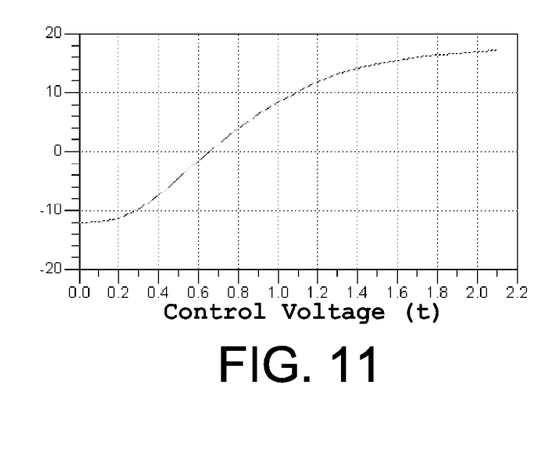
FIG. 11 is an exemplary plot of power output when third order control is applied to a gain stage of an amplifier.
Figure 12:
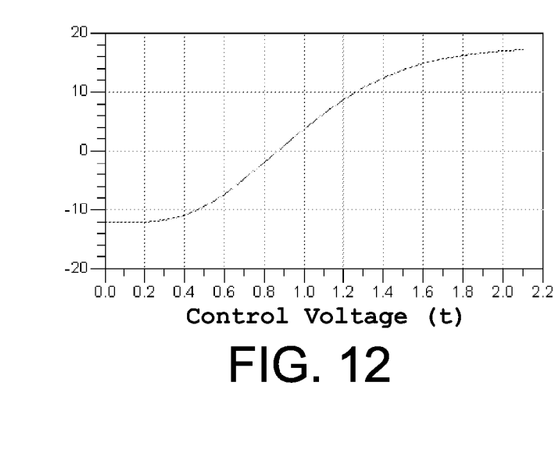
FIG. 12 is an exemplary plot of power output when fourth order control is applied to a gain stage of an amplifier.

In many embodiments based upon Equation (1), the value of "X" will be two or greater, with larger values providing longer periods of linearization and increased delay until the onset of output power. FIGS. 9-12, for example, show the increasing effects of higher order control applied through increasing values of X in the example given above. FIG. 9 shows one example of an output power function resulting from application of linear control based upon $V_{agc}$. FIG. 10 shows an exemplary second order (square) function, and FIGS. 11-12 show exemplary plots of sample third (cubic) and fourth (quartic) order functions, respectively. By comparing FIGS. 9-12 to each other, the increasing linearization in power output and delay to power onset can be readily identified for this example. Higher order control functions and/or other control functions using different parameters could be equivalently applied in any number of equivalent embodiments. Further, the particular relationship between the bias signal and the feedback impedance, as well as the relationship between bias or feedback impedance and amplifier gain, can vary significantly from embodiment to embodiment. Again, the particular relationships between input and output values need not be computed directly, but may be estimated, performed through table lookup and/or otherwise modified as appropriate.

Systems, devices, and methods may therefore be configured in accordance with many different exemplary embodiments. In one embodiment, an amplifier system is provided for amplifying an input signal. The system comprises a bias network configured to generate a bias signal, an amplifier configured to produce an output signal in response to the input signal and the bias signal, a variable impedance coupling the input signal and the output signal in parallel with the amplifier, and a controller configured to apply a weighting function to the variable impedance over at least a startup phase of the amplifier system to thereby extend a time period over which an output power of the amplifier increases to an operating level.

This basic system may be modified or enhanced in many ways, or described in increasing detail in many different ways. For example, the weighting function could be non-linear. The weighting function could be produced in conjunction with a gain control component of the bias signal. The weighting function could be a function of the gain control component of the bias signal. The weighting function applied to the variable impedance applied across the amplifier could comprise an exponentiation of a ramping portion of the bias signal to a power of at least two. The variable impedance could comprise a field effect transistor configured in parallel with a resistor. The controller could be configured to apply a non-linear weighting transfer function to at least one of a gate junction and a drain junction of a field effect transistor to thereby adjust the variable impedance. The feedback loop could comprise a fixed impedance in series with the variable impedance. The amplifier could comprise a plurality of stages and wherein the feedback loop is configured in parallel with a first one of the plurality of stages. The amplifier could comprise a plurality of stages and the feedback loop could be configured in parallel with more than one of the plurality of stages. The amplifier could comprise a bipolar junction transistor. The amplifier could comprise a non-linear amplifying element selected from the group consisting of a metal epitaxial semiconductor field effect transistor, a pseudomorphic high electron mobility transistor, and a silicon or gallium arsenide complementary metal oxide semiconductor. A detector could also be provided that is configured to detect the output power of the amplifier, and wherein the controller is further configured to adjust the variable impedance in response to the detected output power. Many other enhancements, modifications or alternatives could be provided in any number of alternate, but equivalent, embodiments.

In another embodiment, an amplifier system is provided for amplifying an input signal, the system comprising a bias network configured to generate a bias signal, wherein the bias signal comprises a gain control component during a startup phase of the amplifier system, an amplifier configured to produce an output signal having an output power in response to the input signal and the bias signal, a feedback loop comprising a variable impedance coupling the output signal and the input signal, and a controller coupled to the variable impedance and configured to apply a non-linear weighting function to the variable impedance to thereby adjust the gain of the amplifier during at least the startup phase.

This amplifier system may be modified or supplemented in many different ways. For example, the variable impedance could comprise a field effect transistor configured in parallel with a resistor and wherein the controller is configured to apply the non-linear weighting transfer function to at least one of a gate junction and a drain junction of the field effect transistor to thereby adjust the variable impedance. The amplifier could comprise a non-linear amplifying element selected from the group consisting of a bipolar junction transistor, a metal epitaxial semiconductor field effect transistor, a pseudomorphic high electron mobility transistor, and a silicon complementary metal oxide semiconductor. Many other enhancements, modifications or alternatives could be provided in any number of alternate, but equivalent, embodiments.

In still other embodiments, a method of operating a power amplifier comprises providing a bias signal to the power amplifier to thereby bias the power amplifier to a desired operating state, determining an appropriate gain for the amplifier in conjunction with the bias signal to extend a time period over which an output power of the power amplifier increases to an operating power level, and adjusting a variable feedback impedance of the power amplifier to apply the appropriate gain for the amplifier during at least a startup phase of the power amplifier. These basic steps may be executed concurrently, or in any temporal sequence.

The basic method described above may be supplemented or modified in many different ways. For example, the adjusting step could comprise dynamically adjusting the gain of the power amplifier over time with the variable feedback impedance to thereby extend the time period over which the output power of the power amplifier increases in a substantially linear manner toward the operating power level. The variable feedback may be adjusted by applying a transfer function based upon the bias signal to a field effect transistor comprising a source terminal and a drain terminal to thereby change an impedance between the source and drain terminals in a non-linear manner over time. The providing step could comprise applying a voltage ramp during the startup phase. The adjusting step could comprise applying a non-linear weighting function to the variable feedback as the voltage ramp increases. The method could also comprise applying a substantially constant input power signal to the power amplifier. The substantially constant input power signal could be a radio frequency input signal or the like. Many other enhancements, modifications or alternatives could be provided in any number of alternate, but equivalent, embodiments.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier system for amplifying an input signal, the amplifier system comprising:
   a bias network configured to generate a bias signal;
   an amplifier configured to produce an output signal in response to the input signal and the bias signal;
   a variable impedance coupling the input signal and the output signal in parallel with the amplifier; and
   a controller configured to apply a weighting function to the variable impedance over at least a startup phase of the amplifier system to thereby extend a time period over which an output power of the amplifier increases to an operating level.

2. The amplifier system of claim 1 wherein the weighting function is non-linear.

3. The amplifier system of claim 1 wherein the weighting function is produced in conjunction with a gain control component of the bias signal.

4. The amplifier system of claim 3 wherein the weighting function is a function of the gain control component of the bias signal.

5. The amplifier system of claim 4 wherein weighting function applied to the variable impedance applied across the amplifier comprises an exponentiation of a ramping portion of the bias signal to a power of at least two.

6. The amplifier system of claim 1 wherein the variable impedance comprises a field effect transistor configured in parallel with a resistor.

7. The amplifier system of claim 1 wherein the controller is configured to apply a non-linear weighting transfer function to at least one of a gate junction and a drain junction of a field effect transistor to thereby adjust the variable impedance.

8. The amplifier system of claim 1 further comprising a fixed impedance in series with the variable impedance.

9. The amplifier system of claim 1 wherein the amplifier comprises a plurality of stages and wherein a feedback loop comprising the variable impedance is configured in parallel with a first one of the plurality of stages.

10. The amplifier system of claim 1 wherein the amplifier comprises a plurality of stages and a feedback loop comprising the variable impedance is configured in parallel with more than one of the plurality of stages.

11. The amplifier system of claim 1 wherein the amplifier comprises a bipolar junction transistor.

12. The amplifier system of claim 1 wherein the amplifier comprises a non-linear amplifying element selected from a group consisting of a metal epitaxial semiconductor field effect transistor, a pseudomorphic high electron mobility transistor, and a silicon complementary metal oxide semiconductor.

13. The amplifier system of claim 1 further comprising a detector configured to detect the output power of the amplifier, and wherein the controller is further configured to adjust the variable impedance in response to the detected output power.

14. An amplifier system for amplifying an input signal, the amplifier system comprising:
   a bias network configured to generate a bias signal, wherein the bias signal comprises a gain control component during a startup phase of the amplifier system;
   an amplifier configured to produce an output signal having an output power in response to the input signal and the bias signal;
   a feedback loop comprising a variable impedance coupling the output signal and the input signal; and
   a controller coupled to the variable impedance and configured to apply a non-linear weighting function to the variable impedance to thereby adjust the gain of the amplifier during at least the startup phase.

15. The amplifier system of claim 14 wherein the variable impedance comprises a field effect transistor configured in parallel with a resistor and wherein the controller is configured to apply the non-linear weighting transfer function to at least one of a gate junction and a drain junction of the field effect transistor to thereby adjust the variable impedance.

16. The amplifier system of claim 14 wherein the amplifier comprises a non-linear amplifying element selected from a group consisting of a bipolar junction transistor, a metal epitaxial semiconductor field effect transistor, a pseudomorphic high electron mobility transistor, and a silicon complementary metal oxide semiconductor.

17. A method of operating a power amplifier comprising:
   providing a bias signal to the power amplifier to thereby bias the power amplifier to a desired operating state;
   determining an appropriate gain for the amplifier in conjunction with the bias signal to extend a time period over which an output power of the power amplifier increases to an operating power level; and
   adjusting a variable feedback impedance of the power amplifier to apply the appropriate gain for the power amplifier during at least a startup phase of the power amplifier.

18. The method of claim 17 wherein the adjusting step comprises dynamically adjusting the gain of the power amplifier over time with the variable feedback impedance to thereby extend the time period over which the output power of the power amplifier increases in a substantially linear manner toward the operating power level.

19. The method of claim 17 wherein the variable feedback impedance is adjusted by applying a transfer function based upon the bias signal to a field effect transistor comprising a source terminal and a drain terminal to thereby change an impedance between the source and drain terminals in a non-linear manner over time.

20. The method of claim 17 wherein the providing step comprises applying a voltage ramp during the startup phase.

21. The method of claim 20 wherein the adjusting step comprises applying a non-linear weighting function to the variable feedback impedance as the voltage ramp increases.

22. The method of claim 17 further comprising applying a substantially constant input power signal to the power amplifier.

23. The method of claim 22 wherein the substantially constant input power signal is a radio frequency input signal.

* * * * *